(12) United States Patent
Adachi

(10) Patent No.: US 8,492,751 B2
(45) Date of Patent: Jul. 23, 2013

(54) ORGANIC EL DEVICE AND PROCESS FOR MANUFACTURING SAME

(75) Inventor: Kazuya Adachi, Hino (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 315 days.

(21) Appl. No.: 13/003,674

(22) PCT Filed: Apr. 6, 2009

(86) PCT No.: PCT/JP2009/057073
§ 371 (c)(1),
(2), (4) Date: Apr. 4, 2011

(87) PCT Pub. No.: WO2010/023987
PCT Pub. Date: Mar. 4, 2010

(65) Prior Publication Data
US 2011/0186822 A1    Aug. 4, 2011

(30) Foreign Application Priority Data

Aug. 26, 2008  (JP) ................................ 2008-216871
Sep. 25, 2008  (JP) ................................ 2008-245914

(51) Int. Cl.
*H01L 35/24*    (2006.01)

(52) U.S. Cl.
USPC ...................... 257/40; 257/100; 257/E51.001

(58) Field of Classification Search
USPC ..................... 257/40, 100, E51.001
See application file for complete search history.

(56) References Cited

U.S. PATENT DOCUMENTS

| 6,190,788 B1 | 2/2001 | Shibuya et al. |
| 2004/0238104 A1 | 12/2004 | Suzuki et al. |
| 2005/0218803 A1 | 10/2005 | Takeuchi et al. |
| 2007/0182322 A1 | 8/2007 | Nagayama |
| 2008/0211066 A1 | 9/2008 | Akedo et al. |
| 2011/0175137 A1 | 7/2011 | Utumi |

FOREIGN PATENT DOCUMENTS

| CN | 1612650 A | 5/2005 |
| JP | 6291114 A | 10/1994 |
| JP | 2004-335127 A | 11/2004 |
| JP | 2005-209356 A | 8/2005 |
| JP | 2005-285659 A | 10/2005 |
| JP | 2006-261073 A | 9/2006 |
| JP | 2007-123067 A | 5/2007 |
| JP | 2008-214677 A | 9/2008 |
| KR | 2000-0006436 A | 1/2000 |
| KR | 2007-0080834 A | 8/2007 |
| WO | WO-2010/010622 A1 | 1/2010 |

*Primary Examiner* — Anthony Ho

(74) *Attorney, Agent, or Firm* — Rabin & Berdo. P.C.

(57) ABSTRACT

Provided is an organic EL device capable of maintaining an excellent luminous efficiency over an extended period of time, particularly in a top emission-type EL device. The organic EL device of the invention includes a substrate and an organic EL element formed on the substrate. The organic EL element is composed of a bottom electrode, an organic EL layer, a top electrode and a protective layer. The protective layer is composed of one or a plurality of inorganic films, and at least one of the one or plurality of inorganic films is an SiON:H film having stretching-mode peak area ratios, as determined by infrared absorption spectroscopy, that include an absorption area ratio of N—H bonds to Si—N bonds in the SiON:H film which is not less than 0.04 but not more than 0.07 and an absorption area ratio of Si—H bonds to Si—N bonds which is not more than 0.15.

8 Claims, 3 Drawing Sheets

ORGANIC EL DEVICE AND PROCESS FOR MANUFACTURING SAME

BACKGROUND OF THE INVENTION

1. Field of the Invention

The present invention relates to an organic electroluminescent (EL) device useful in display applications, and to a process for manufacturing the same. More specifically, the invention relates to an organic EL device which prevents the infiltration of moisture from the external environment and exhibits an excellent luminous efficiency over an extended period of time, and to a process for manufacturing the same.

2. Background of the Related Art

Recently, in connection with display applications, research is actively being carried out on organic EL devices that use self-luminescent organic EL elements. There is an expectation that organic EL devices will achieve high luminance and luminous efficiency, the reason being that such devices can manifest a high current density at low voltage. The practical use of high-definition multicolor-emitting organic EL devices capable of full-color display is especially anticipated in the technical field of displays.

Key challenges for the practical implementation of organic EL devices as color displays are achieving a high degree of definition, and also imparting the devices with long-term stability, including color reproducibility. However, a drawback of multicolor-emitting organic EL devices is that, when driven for a fixed length of time, a dramatic falloff in the emission characteristics (current-luminance characteristics) occurs.

A typical cause of this decline in the emission characteristics is the growth of dark spots. Here, the term 'dark spot' refers to an emission point defect. Such dark spots are thought to arise as the oxidation or aggregation of material in the component layers of an organic EL element proceeds under the effects of oxygen or moisture within the device during driving and storage. The growth of dark spots proceeds not only during power is on but also during storage. In particular, the growth of dark spots is thought to be (1) accelerated by oxygen or moisture present in the external environment around the element, (2) affected by oxygen or moisture present as adsorbed matter within the component layers, and (3) influenced by moisture already adsorbed onto components that are used in device manufacture or by the infiltration of moisture at the time of manufacture. As such growth continues, the dark spots spread throughout the light-emitting face of the organic EL device.

Methods in which the organic EL element is sealed using a metal casing or a glass sheet or in which a drying agent is placed within a space where the organic EL element is sealed have hitherto been carried out as the means for preventing moisture infiltration into the component layers of the organic EL element. However, to take advantage of the light weight and thin profile which are distinctive features of organic EL devices, technology that seals by means of a thin-film without using a drying agent has been attracting attention.

Thin films that are used for sealing include silicon nitride and silicon nitride oxide. However, to minimize damage to the emissive layer at the time of film formation from such materials, it is essential to hold the temperature rise at the film-forming surface to not more than the glass transition temperature of the emissive layer. For this reason, the film-forming methods that have been developed in semiconductor processes cannot be employed in organic EL devices, making it impossible to form a thin-film for sealing which has sufficient moisture resistance.

To address this challenge, Patent Document 1 describes, as a sealing thin-film capable of being employed in organic EL devices, a film composed primarily of silicon and silicon nitride that is formed by plasma chemical vapor deposition (CVD). Japanese Patent Application Laid-open No. 2005-285659 (Patent Document 1) discloses that, by having the number of silicons bonded to silicon relative to the number of silicons bonded to nitrogen, as measured by x-ray photoelectron spectroscopy, be at least 0.6 but not more than 2.0, such a film exhibits excellent sealability.

Recently, so-called top-emission structure type devices which, in order to increase the aperture ratio of an active matrix drive organic EL device, output light on the side of the substrate opposite from that where a switching circuit containing thin-film transistors (TFT) and the like has been fabricated, have become prevalent. In this structure, a transparent electrode and a sealing film are formed on the organic EL layer, and the light generated by the organic EL layer is emitted to the exterior through the sealing film. However, because the sealing film of Patent Document 1 contains a considerable amount of silicon-silicon bonds, it has a low visible-light transmittance, and thus cannot be used as the sealing film in a top-emission structure.

The object of the invention is to provide an organic EL device which uses a protective layer having a high visible-light transmittance and excellent moisture resistance, and is thus endowed with long-term stability.

A further object of the invention is to provide a process for manufacturing such an organic EL device.

SUMMARY OF THE INVENTION

The organic EL device of the present invention includes a substrate; and an organic EL element formed on the substrate. The organic EL element comprises a bottom electrode; an organic EL layer; a top electrode and a protective layer. The protective layer is composed of one or a plurality of inorganic films, and at least one of the plurality of inorganic films is a hydrogen-containing silicon oxide nitride film having stretching-mode peak area ratios, as determined by infrared absorption spectroscopy, that include an absorption area ratio of N—H bonds to Si—N bonds in the hydrogen-containing silicon oxide nitride film which is not less than 0.04 but not more than 0.07 and an absorption area ratio of Si—H bonds to Si—N bonds which is not more than 0.15. The organic EL device of the invention may have a structure in which the protective layer is positioned between and in contact with the substrate and the bottom electrode. Alternatively, the organic EL device of the invention may have a structure in which the protective layer is positioned on and in contact with a top side of the top electrode, and the bottom electrode is in contact with the substrate. Also, it is desirable for each of the one or plurality of inorganic films to have a stress with an absolute value smaller than 20 MPa.

The absorption areas for the N—H bonds, Si—H bonds and Si—N bonds in the present invention are determined by the steps of: (a) measuring an infrared absorption spectrum for the silicon oxide nitride film with wavenumber as the horizontal axis, (b) correcting the obtained infrared absorption spectrum by subtracting a baseline therefrom, (c) peak-separating the absorption of the N—H bonds, Si—H bonds and Si—N bonds by using Gaussian functions, and (d) determining surface areas of the separated peaks. Here, the absorption area of the N—H bonds is determined from a peak present at 3250 to 3400 cm$^{-1}$, the absorption area of the Si—H bond is determined from a peak present at 2100 to 2200 cm$^{-1}$, and the absorption area of the Si—N bond is determined from a peak present at 830 to 870 cm$^{-1}$.

The inventive method of manufacturing an organic EL device comprises the steps of (1) preparing a substrate; and (2) forming an organic EL element including a bottom electrode; an organic EL layer; a top electrode; and a protective layer composed of one or a plurality of inorganic films in which at least one of the one or a plurality of inorganic films is a hydrogen-containing silicon oxide nitride film having stretching-mode peak area ratios, as determined by infrared absorption spectroscopy, that include an absorption area ratio of N—H bonds to Si—N bonds in the hydrogen-containing silicon oxide nitride film which is not less than 0.04 but not more than 0.07 and an absorption area ratio of Si—H bonds to Si—N bonds which is not more than 0.15. In step (2), the hydrogen-containing silicon oxide nitride film is formed by chemical vapor deposition in which radio frequency power of at least 25 MHz but not more than 60 MHz is applied to a mixed gas containing monosilane, ammonia, $N_2O$ and nitrogen at a flow rate ratio of ammonia to monosilane which is at least 0.5 but not more than 1 and a flow rate ratio of $N_2O$ to monosilane which is greater than 0 but smaller than 0.2.

There has existed a desire in recent years for the development of organic EL displays having a higher luminous efficiency. In response to this need, the present invention uses a protective layer having an excellent moisture resistance to provide an organic EL device which can maintain an excellent luminous efficiency over an extended period of time. Moreover, the protective layer of the invention has a high visible-light transmittance, making the inventive arrangement particularly effective in top emission-type organic EL devices.

DETAILED DESCRIPTION OF THE INVENTION

The organic EL device of the invention includes a substrate and an organic EL element formed on the substrate. The organic EL element is composed of a bottom electrode, an organic EL layer, a top electrode, and a protective layer. The protective layer is a hydrogen-containing silicon oxide nitride film which has stretching-mode peak area ratios, as determined by infrared absorption spectroscopy, that include an absorption area ratio of N—H bonds to Si—N bonds in the hydrogen-containing silicon oxide nitride film which is greater than 0.05 but not more than 0.07 and an absorption area ratio of Si—H bonds to Si—N bonds which is not more than 0.15.

Figure 1:
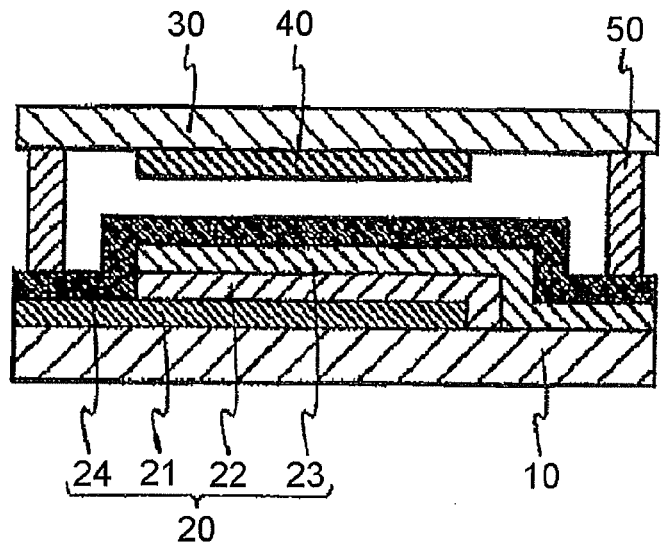
FIG. 1 is cross-sectional diagram showing one example of an organic EL device according to the present invention.

FIG. 1 shows an example of the organic EL device of the present invention. The organic EL device in FIG. 1 is a top emission-type organic EL device which includes a substrate 10 and, provided on the substrate 10, an organic EL element 20 obtained by forming in order: a bottom electrode 21, an organic EL layer 22, a top electrode 23 and a protective layer 24. In an optional configuration, a sealing substrate 30 with a color-converting filter layer 40 mounted thereto is bonded by means of a bonding layer 50 to the side of the substrate 10 where the organic EL element 20 has been formed.

Figure 2:
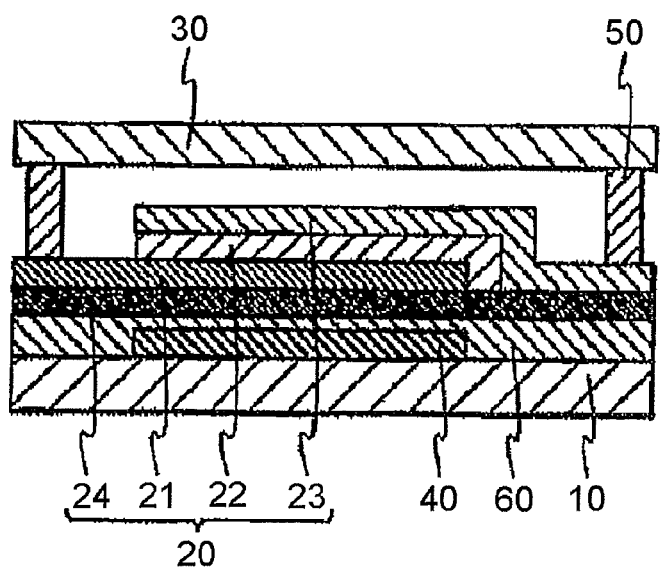
FIG. 2 is a cross-sectional diagram showing another example of the organic EL device of the invention.

FIG. 2 shows another example of an organic EL device of the invention. In the example in FIG. 2, the protective layer 24 is positioned between the substrate 10 and the bottom electrode 21. The organic EL device in FIG. 2 is a bottom emission-type organic EL device. The example shown in FIG. 2 additionally includes, as optional elements between the substrate 10 and the protective layer 24, a color-converting filter layer 40 and a planarizing layer 60.

The substrate 10 of the present invention can be formed using any material capable of withstanding the various conditions (e.g., solvent used, temperature) employed in forming the other component layers. In addition, it is desirable for the substrate 10 to have an excellent dimensional stability. Transparent materials that may be used to form the substrate 10 include glass and resins such as polyolefins, polymethyl methacrylate and other acrylic resins, polyethylene terephthalate and other polyester resins, polycarbonate resins, and polyimide resins. When such resins are used, the substrate 10 may be either rigid or flexible. Alternatively, particularly in the case of the top emission-type organic EL device shown in FIG. 1, the substrate 10 may be formed using an opaque material such as silicon or ceramic. Formation may be carried out using a planar material which is electrically insulating and has a rigidity capable of maintaining the form of the organic EL element.

The substrate 10 may further include on the surface thereof a plurality of switching elements (e.g., TFT) and wiring. This arrangement is effective in the manufacture of active matrix drive organic EL devices having a plurality of independent light-emitting regions.

The bottom electrode 21 positioned between the substrate 10 and the organic EL layer 22 and the top electrode 23 positioned on the opposite side of the organic EL layer 22 from the substrate 10 have the functions of carrier injection to the organic EL layer 22 and connection with an external drive circuit. The bottom electrode 21 and the top electrode 23 may each be either an anode (hole injection electrode) or a cathode (electron injection electrode), with one of the bottom electrode 21 and the top electrode 23 being an anode and the other being a cathode. Also, the bottom electrode 21 or the top electrode 23, provided one of these is a transparent electrode, may be either a reflecting electrode or a transparent electrode. In the top emission-type structure shown in FIG. 1, it is desirable for the bottom electrode 21 to be a reflecting electrode and the top electrode 23 to be a transparent electrode. In the bottom emission-type structure shown in FIG. 2, it is desirable for the top electrode 23 to be a reflecting electrode and the bottom electrode 21 to be a transparent electrode.

The reflecting electrode which may be used as the bottom electrode 21 or the top electrode 23 may be formed using a high-reflectance metal (e.g., aluminum, silver, molybdenum, tungsten, nickel, chromium) or an alloy thereof, or an amorphous alloy (e.g., NiP, NiB, CrP, CrB). Materials which are especially preferred from the standpoint of being able to achieve a reflectance to visible light of at least 80% include silver alloys. Silver alloys that can be used include alloys of silver with at least one metal selected from among the Group 10 elements nickel and platinum, the Group 1 element rubidium, and the Group 14 element lead; and alloys of silver with at least one metal selected from among the Group 2 elements magnesium and calcium.

The transparent electrode that may be used as the bottom electrode 21 or the top electrode 23 may be formed using an electrically conductive metal oxide such as $SnO_2$, $In_2O_3$, In—Sn oxide, In—Zn oxide, ZnO or Zn—Al oxide. Because the transparent electrode serves as the pathway through which light emitted from the organic EL layer 22 exits to the exterior, it is desirable for this electrode to have a transmittance within a wavelength range of 400 to 800 nm of at least 50%, and preferably at least 85%.

The bottom electrode 21 and the top electrode 23 can be formed by using a resistance heating-type or electron beam heating-type vapor deposition process, or by using a sputtering process. When vapor deposition is used, film formation may be carried out at a film-forming rate of from 0.1 to 10 nm/s under a pressure of $1.0 \times 10^{-4}$ Pa or below. On the other hand, when a sputtering process such as DC magnetron sputtering is used, film formation may be carried out using an inert gas such as argon as the sputtering gas under a pressure of about 0.1 to 2.0 Pa. When the top electrode 23 is formed by a sputtering process, to prevent deterioration of the organic EL layer 22 which serves as the surface of the film-forming substrate, it is preferable not to expose the organic EL layer 22 directly to plasma formed near the target.

The organic EL layer 22 is positioned between the bottom electrode 21 and the top electrode 23, and is in contact with each electrode. This layer serves as the core of the light-emitting region. The organic EL layer 22 includes at least an emissive layer and, where necessary, includes a hole transport layer, a hole injection layer, an electron transport layer and/or an electron injection layer. For example, the organic EL layer 22 may have the following layer configurations:

(1) anode/emissive layer/cathode.
(2) anode/hole injection layer/emissive layer/cathode.
(3) anode/emissive layer/electron injection layer/cathode.
(4) anode/hole injection layer/emissive layer/electron injection layer/cathode.
(5) anode/hole transport layer/emissive layer/electron injection layer/cathode.
(6) anode/hole injection layer/hole transport layer/emissive layer/electron injection layer/cathode.
(7) anode/hole injection layer/hole transport layer/emissive layer/electron transport layer/electron injection layer/cathode.

In each of the above configurations (1) to (7), the anode and the cathode are respectively either the bottom electrode 21 or the top electrode 23.

The emissive layer may be formed using a known material. Exemplary materials for obtaining luminescence which is blue to blue-green include fluorescent whitening agents such as benzothiazole compounds, benzoimidazole compounds and benzoxazole compounds; metal-chelated oxonium compounds such as aluminum complexes, an example of which is the tris(8-hydroxyquinolinato)aluminum complex ($Alq^3$); styrylbenzene compounds such as 4,4'-bis(diphenylvinyl)biphenyl (DPVBi); aromatic dimethylidyne compounds; condensed aromatic ring compounds; ring assembly compounds; and porphyrin compounds.

Alternatively, emissive layers which emit light at various wavelengths can be formed by the addition of dopant to a host compound. In such cases, distyrylarylene compounds, N,N'-ditolyl-N,N'-diphenylbiphenylamine (TPD), $Alq_3$, etc. may be used as the host compound. Perylene (blue-violet), coumarin 6 (blue), quinacridone compounds (blue-violet to violet), rubrene (yellow), 4-dicyanomethylene-2-(p-dimethylaminostyryl)-6-methyl-4H-pyran (DCM, red), platinum octaethylporphyrin complex (PtOEP, red), etc. may be used as the dopant.

The hole transport layer may be formed using a material having a triarylamine partial structure, a carbazole partial structure or an oxadiazole partial structure. Preferred materials for the hole transport layer include TPD, 4,4'-bis[N-(1-naphthyl)-N-phenylamino]biphenyl (α-NPD), MTDAPB (o-, m-, p-) and m-MTDATA. The hole injection layer may be formed using phthalocyanines (Pc) such as copper phthalocyanine complex (CuPc), or materials such as indanthrene compounds.

The electron transport layer may be formed using the following materials: aluminum complexes such as $Alq_3$, oxadiazole derivatives such as PBD or TPOB, triazole derivatives such as TAZ, triazine derivatives, phenyl quinoxalines, and thiophene derivatives such as BMB-2T, etc. The electron injection layer may be formed using the following materials: aluminum complexes such as $Alq_3$, or aluminum quinolinole derivatives doped with an alkali metal or an alkaline earth metal.

In addition to each the component layers such as the above, a buffer layer to further increase the carrier injection efficiency between the organic EL layer 22 and either the bottom electrode 21 or the top electrode 23 used as the cathode may be optionally formed (not shown). The buffer layer may be formed using an electron-injecting material, examples of which include alkali metals, alkaline earth metals and alloys thereof, rare-earth metals, or fluorides of such metals.

In addition, to mitigate damage to the top surface of the organic EL layer 22 during formation of the top electrode 23, it is preferable to form a damage mitigation layer (not shown) composed of MgAg or the like.

It is important that each layer making up the organic EL layer 22 have a film thickness sufficient to achieve the desired properties. In this invention, it is desirable for the emissive layer, the hole transport layer, the electron transport layer and the electron injection layer to each have film thicknesses of from 2 to 50 nm, and for the hole injection layer to have a film thickness of from 2 to 200 nm. From the standpoint of lowering the drive voltage and increasing transparency, it is preferable for the optional buffer layer to have a film thickness of not more than 10 nm.

Each of the component layers of the organic EL layer 22, the buffer layer and the damage mitigation layer may be formed using any means that is known to the art, such as vapor deposition (resistance heating vapor deposition or electron beam heating vapor deposition).

The protective layer 24 is a layer for preventing the infiltration of moisture to the electrodes and/or the organic EL layer 22 from the external environment or from a layer which may contain moisture. The protective layer 24 is a hydrogen-containing silicon oxide nitride (SiON:H) film. In cases where the protective layer 24 is composed of a plurality of inorganic films, from the standpoint of the ease of film formation, it is preferable for the additional films to be silicon-based films.

The protective layer 24 may be provided on the top electrode 23 so as to be in contact therewith, in the manner shown in FIG. 1, or may be provided between the substrate 10 and the bottom electrode 21, in the manner shown in FIG. 2. If necessary, protective layers 24 may be provided both on the top electrode 23 and between the substrate 10 and the bottom electrode 21.

To prevent delamination, it is desirable for the inorganic film making up the protective layer 24 to have a low stress. In the present invention, regardless of whether such stress is induced by shrinkage or expansion, it is desirable for the stress of the inorganic film to have an absolute value of not more than 20 MPa. The stress may be determined by, for example, forming an inorganic film on the silicon wafer and determining the amount of change in silicon wafer warp before and after formation of the inorganic film.

When positioned on the pathway of light emission to the exterior from the organic EL layer, it is desirable for the protective layer 24 to have a high visible-light transmittance. Specifically, it is desirable for the transmittance of light within a wavelength range of from 400 to 800 nm to be at least 50%, and preferably at least 85%. Moreover, it is desirable for the protective layer 24 to have an excellent moisture resistance. The inventors have discovered that the excellent moisture resistance and high visible-light transmittance of the protective layer 24 is achieved by using a SiON:H film in which the absorption area ratio of N—H bonds to Si—N bonds (referred to below as the "N—H/Si—N area ratio") is greater than 0.05 but not more than 0.07 and the absorption area ratio of Si—H bonds to Si—N bonds (referred to below as the "Si—H/Si—N area ratio") is not more than 0.15.

The SiON:H film making up the protective layer 24 may be formed using chemical vapor deposition (CVD). Plasma CVD carried out by applying radio-frequency power is especially preferred. To achieve the above N—H/Si—N area ratio and Si—H/Si—N area ratio, it is desirable to set the frequency of the radio-frequency power to at least 25 MHz but not more than 40 MHz. Using radio-frequency power having a frequency of 27.12 MHz or more is more preferred. The power density of the radio-frequency power is preferably set to from 0.1 to 2 W/cm$^2$. From the standpoint of avoiding damage to the substrate 10 and layers already formed on the substrate 10, it is preferable to carry out SiON:H film formation at a substrate temperature of not above 70° C.

In forming the SiON:H film by a plasma CVD process, a mixture of monosilane, ammonia, $N_2O$ and inert gas may be used as the source gas. The use of a mixed gas of monosilane, ammonia, $N_2O$ and nitrogen is especially preferred. Here, to achieve the high visible-light transmittance of a SiON:H film, it is preferable to set the flow rate ratio of ammonia to monosilane to at least 0.5. In addition, to achieve the excellent moisture resistance of the SiON:H film, it is desirable that the flow rate ratio of ammonia to monosilane be set to 1 or below, and that the flow rate ratio of $N_2O$ to monosilane be made larger than 0 but smaller than 0.2. In addition, by setting the flow rate ratio of ammonia to monosilane to at least 0.5 but not more than 1 and setting the flow rate ratio of $N_2O$ to monosilane to more than 0 and less than 0.2, the absolute value for the stress of the resulting SiON:H film can be set to 20 MPa or less. The above-described flow rate ratios are effective also for satisfying the N—H/Si—N area ratio and Si—H/Si—N area ratio requirements.

The method for determining the N—H/Si—N area ratio and the Si—H/Si—N area ratio in the invention is described. First, the IR spectrum for the SiON:H film is measured. In this invention, the stretching-mode absorption is used as the IR spectrum. The use of stretching-mode absorption is preferred because the absorption intensities are high and peak separation is easy. The spectrum is represented using a linear axis for wavenumber (units: cm$^{-1}$) as the horizontal axis, and has no partially enlarged areas. Here, to eliminate background absorption, it is desirable to measure the IR spectrum of a film-forming substrate on which an SiON:H film has been formed and the IR spectrum of a film-forming substrate on which an SiON:H film has not been formed, and determine the difference spectrum therebetween.

Figure 3:
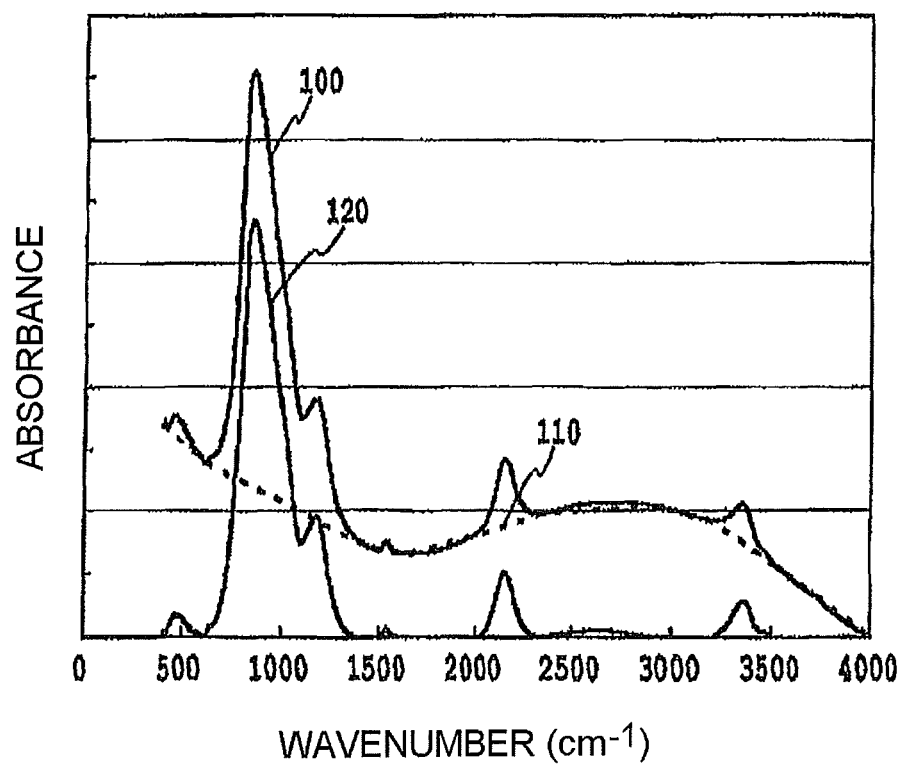
FIG. 3 shows an infrared absorption (IR) spectrum for determining the ratios of Si—N bonds, Si—H bonds and N—H bonds in a silicon oxide nitride film.

The resulting IR spectrum includes fluctuations in absorbance due to light interference within the film. To eliminate such absorbance fluctuations, correction using a baseline is carried out. FIG. 3, which is a diagram illustrating this correction step, shows the IR spectrum 100 as measured, the baseline 110, and the IR spectrum 120 following baseline correction. The baseline for the SiON:H film in this invention is obtained by connecting with straight lines the absorbances at the following wavenumbers in the IR spectrum 100: 400, 612, 1500, 1650, 2030, 2330, 2900, 3200, 3550, 4000 (cm$^{-1}$).

Next, at each of the wavenumbers, the baseline 110 absorbance is subtracted from the IR spectrum 100 absorbance, giving the baseline-corrected IR spectrum 120.

Next, peak separation is carried out on the baseline-corrected IR spectrum 120. This is done by expressing each peak as a Gaussian function G, represented by formula (I) below:

$$G_n = A_n \exp(-B_n(x-C_n)^2) \quad (I).$$

Figure 4:
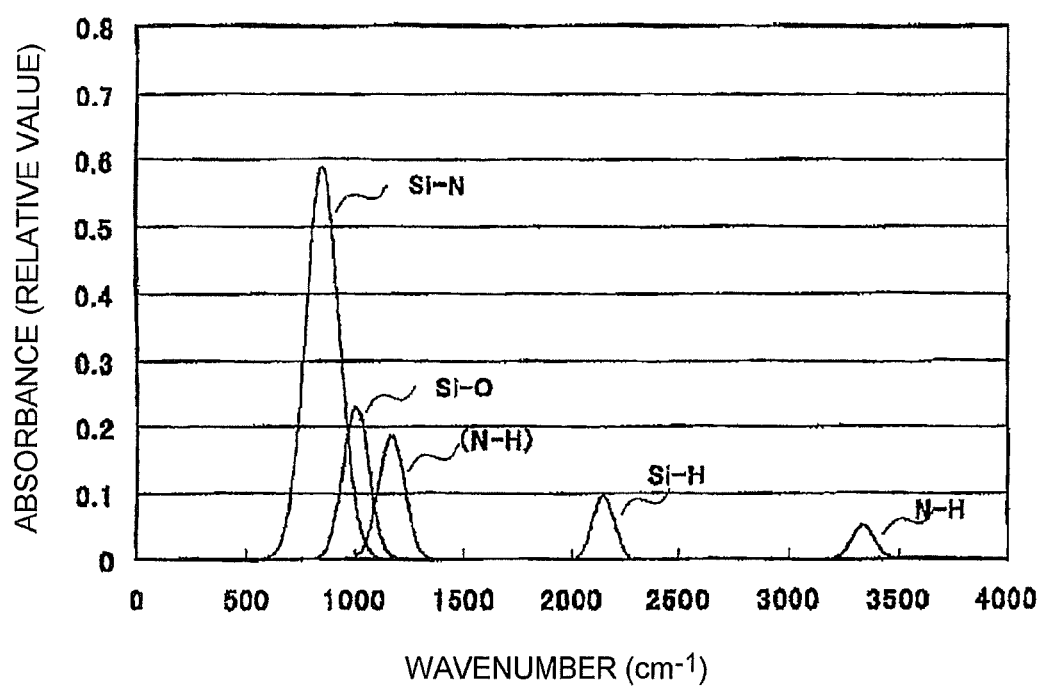
FIG. 4 shows an IR spectrum in which the peaks have been separated in order to determine the ratios of Si—N bonds, Si—H bonds and N—H bonds in a silicon oxide nitride film.

In the formula, $A_n$ is the absorbance maximum for each peak, $C_n$ is the wavenumber (units: cm$^{-1}$) at which the absorbance of the peak reaches its maximum value, x is the wavenumber, and $B_n$ is a variable. The $B_n$ for each peak is determined using the method of least squares. That is, the individual peaks are separated by having the sum of the squares of the differences between the sum of the Gaussian function $G_n$ for each peak and the absorbance of the baseline-corrected IR spectrum 120 be a minimum value. FIG. 4 shows the results that were obtained by carrying out peak separation on the baseline-corrected IR spectrum 120 in FIG. 3.

In this invention, the peak having a maximum at 830 to 870 cm$^{-1}$ is treated as the peak representing the Si—N bond stretching mode, the peak having a maximum at 2100 to 2200 cm$^{-1}$ is treated as the peak representing the Si—H bond stretching mode, and the peak having a maximum at 3250 to 3400 cm$^{-1}$ is treated as the peak representing the N—H bond stretching mode. In FIG. 4, the peak having a maximum at about 1200 cm$^{-1}$ is from the N—H bonds, but is not used to calculate the N—H/Si—N area ratio in the present invention.

Finally, the Gaussian function $G_n$ for each peak obtained by peak separation is integrated, thereby determining the absorption surface areas of the N—H bonds, Si—H bonds and Si—N bonds, from which the N—H/Si—N area ratio and the Si—H/Si—N area ratio are determined.

The sealing substrate 30 may be formed using, for example, glass, a metal such as stainless steel or aluminum; or a resin such as a polyolefin, an acrylic resin (e.g., polymethyl methacrylate), a polyester resin (e.g., polyethylene terephthalate), a polycarbonate resin or a polyimide resin. When a resin is used, the sealing substrate 30 may be rigid or flexible. In a top emission-type structure like that shown in FIG. 1, because the sealing substrate 30 itself serves as the pathway for emission to the exterior of luminescence from the organic EL layer 22, it is desirable to form the sealing substrate 30 using a transparent material such as glass or a resin.

The color-converting filter layer 40 is a layer for adjusting the hue of the luminescence emitted from the organic EL layer 22. In this invention, "color-converting filter layer" serves as a generic term for color filter layers, color conversion layers, and laminates of a color filter layer and a color conversion layer. The color-converting filter layer 40 may be provided on the inside of the sealing substrate 30 as shown in FIG. 1, or may be provided between the substrate 10 and the bottom electrode 21 as shown in FIG. 2. The color-converting filter layer 40 is difficult to completely dry for the sake of protecting the dye present therein, leaving the possibility that moisture will be present. Therefore, when the color-converting filter layer 40 is provided on the inside of the sealing substrate as shown in FIG. 1, it is preferable to provide the protective layer 24 on the top side of the top electrode 23. Likewise, when the color-converting filter layer 40 is provided between the substrate 10 and the bottom electrode 21 as shown in FIG. 2, it is preferable to provide the protective layer 24 between the color-converting filter layer 40 and the bottom electrode 21.

A color filter layer is a layer which allows light of a specific wavelength to pass through. Such a color filter layer functions to increase the color purity of light from the organic EL layer 22 or the color conversion layer. The color filter layer may be formed by using a commercial color filter material for flat panel displays (e.g., Color Mosaic, available from Fujifilm Electronics Materials). Coating methods such as spin coating, roll coating, casting and dip coating may be used to form the color filter layer. A color filter layer having the desired pattern may be formed by using a process such as photolithography to pattern the film formed by the coating method.

A color conversion layer is a layer which absorbs light of a specific wavelength, carries out wavelength distribution and conversion, and emits light of a different wavelength. The color conversion layer includes at least a fluorescent dye and, if necessary, may include a matrix resin. The fluorescent dye absorbs light from the organic EL layer 22 and emits light of the desired wavelength (e.g., red region, green region or blue region).

Illustrative examples of fluorescent dyes which absorb light in the blue to blue-violet region and emit fluorescence in the red region include Rhodamine dyes such as Rhodamine B, Rhodamine 6G, Rhodamine 3B, Rhodamine 101, Rhodamine 110, Sulforhodamine, Basic Violet 11 and Basic Red 2; cyanine dyes, pyridine dyes such as 1-ethyl-2-[4-(p-dimethylaminophenyl)-1,3-butadienyl]-pyridinium perchlorate (Pyridine 1); and oxazine dyes. Alternatively, use may be made of various other colorants having the above type of fluorescence (e.g., direct dyes, acid dyes, basic dyes, disperse dyes).

Illustrative examples of fluorescent dyes which absorb light in the blue to blue-violet region and emit fluorescence in the green region include coumarin dyes such as 3-(2'-benzothiazolyl)-7-diethylaminocoumarin (Coumarin 6), 3-(2'-benzoimidazolyl)-7-diethylaminocoumarin (Coumarin 7), 3-(2'-N-methylbenzoimidazolyl)-7-diethylaminocoumarin (Coumarin 30) and 2,3,5,6-1H,4H-tetrahydro-8-trifluoromethylquinolidine (9,9a,1-gh)coumarin (Coumarin 153); naphthalimide dyes such as Solvent Yellow 11 and Solvent Yellow 116; and coumarin-based colorants such as Basic Yellow 51. Alternatively, use may be made of various other colorants having the above type of fluorescence (e.g., direct dyes, acid dyes, basic dyes, disperse dyes).

The matrix resin of the color conversion layer may be an acrylic resin, various types of silicone polymer, or any material capable of being used in place of these. For example, the matrix resin used may be an unmodified silicone polymer or a modified resin-type silicone polymer.

The color conversion layer may be formed by a coating method such as spin coating, roll coating, casting or dip coating, or by a vapor deposition process. In cases where the color conversion layer is formed using a plurality of fluorescent dyes, this may be done by mixing the plurality of fluorescent dyes in a specific ratio together with the matrix resin to form a preliminary mixture, then using this preliminary mixture to carry out vapor deposition. Alternatively, the color conversion layer may be formed using a co-deposition process. The co-deposition process may be carried out by placing each of the plurality of fluorescent dyes at separate heating sites, and heating these separately. If necessary, a mixture of fluorescent dye and matrix resin may be placed at a heating site and used as the deposition source. The use of a co-deposition process is particularly advantageous in cases where the properties of the plurality of fluorescent dyes (rate of deposition and/or vapor pressure, etc.) differ considerably.

When a color-converting filter layer 40 containing a color conversion layer is used, to prevent deterioration in the properties of the color conversion layer, a passivation layer (not shown) may be formed so as to cover the entire color-converting filter layer 40. The passivation layer may be formed using an insulating oxide (e.g., $SiO_x$, $TiO_2$, $ZrO_2$, $AlO_x$) or an insulating nitride ($AlN_x$, $SiN_x$). The passivation layer may be formed using a process such as plasma CVD. To help prevent deterioration of the color conversion layer, during formation of the passivation layer, it is desirable to set the temperature of the film-forming substrate where the color-converting filter layer 40 becomes the uppermost layer to 100° C. or below.

As shown in FIG. 2, when the color-converting filter layer 40 is formed between the substrate 10 and the bottom electrode 21, it is desirable to form a planarizing layer 60 so as to cover the color-converting filter layer 40. The planarizing layer 60 renders the surface for forming the organic EL element 20 planar, and is effective for preventing the generation of defects such as disconnections and electrical shorts within the organic EL element. The planarizing layer 60 may be formed using, for example, a photocurable resin, a resin that is both photocurable and heat-curable, a heat-curable resin, or a thermoplastic resin. The planarizing layer 60 may be formed using a coating method such as spin coating, roll coating, casting or dip coating.

The bonding layer 50 is a layer used to join together the substrate 10 and the sealing substrate 30. The bonding layer 50 may be formed using, for example, a UV-curable adhesive or an adhesive that is both UV-curable and heat-curable. To reduce the influence of heat on the organic EL layer 22, it is desirable to use an adhesive that is both UV-curable and heat-curable. Adhesives that are both UV-curable and heat-curable which can be used include epoxy resin adhesives. Here, the adhesive may include spacer particles to define the distance between the substrate 10 and the sealing substrate 30. Spacer particles that may be used include glass beads. The bonding layer 50 may be formed by coating the adhesive at a predetermined position on the surface of either the substrate 10 or the sealing substrate 30, joining together the substrate 10 and the sealing substrate 30, and curing the adhesive. It is desirable to provide the bonding layer 50 at positions where the light-emitting regions of the organic EL element 20 are not present, such as at the peripheral edges of the substrate 10 and the sealing substrate 30.

FIGS. 1 and 2 show examples of organic EL devices having a single light-emitting region. However, the organic EL device of the invention may have a plurality of independently controlled light-emitting regions. For example, a so-called passive matrix drive organic EL device may be formed by providing both the bottom electrode and the top electrode as electrode groups composed of a plurality of stripe-like electrodes, and having the stripe-like electrodes which make up the bottom electrode extend in a direction that intersects the direction in which the stripe-like electrodes making up the top electrode extend. Here, in display applications for displaying desired images and/or text, it is preferable to have the stripe-like electrodes which make up the bottom electrode extend in a direction that intersects the direction in which the stripe-like electrodes making up the top electrode extend. Alternatively, an active matrix drive organic EL device may be formed by dividing the bottom electrode into a plurality of partial electrodes, connecting each of the plurality of partial electrodes one-to-one with switching elements formed on the substrate, and having the top electrode be a common electrode that is monolithic.

Both in the case of a passive matrix drive device and in the case also of an active matrix drive device, it is desirable to provide an insulating film between the plurality of partial electrodes making up the bottom electrode. The insulating film can be formed using an insulating oxide (e.g., $SiO_x$, $TiO_2$, $ZrO_2$, $AlO_x$), an insulating nitride (e.g., $AlN_x$, $SiN_x$) or a polymeric material.

Moreover, in a configuration having a plurality of independently controlled light-emitting regions, an organic EL device capable of multicolor display can be formed by using a plurality of color-converting filter layers. For example, by using red, green and blue color-converting filter layers to make up red, green and blue subpixels and arraying as a matrix pixels, each of which is composed of a set of such subpixels in three colors, an organic EL device capable of full-color display can be formed.

EXAMPLES

Production Example 1

In this production example, a SiON:H film was formed by applying radio-frequency power to a mixed gas of monosilane ($SiH_4$), ammonia ($NH_3$), nitrous oxide ($N_2O$) and nitrogen, and the properties of the film were evaluated. The flow rate of monosilane was set at 100 sccm, the flow rate of ammonia was set at 70 sccm, the flow rate of nitrogen was set at 2,000 sccm, and the flow rate of $N_2O$ was varied in a range of from 0 to 100 sccm. The pressure of the mixed gas was set to 100 Pa. In addition, using radio-frequency power have a frequency of 27.12 MHz and a power density of 0.5 $W/cm^2$, a SiON:H film was formed on a 50° C. film-forming substrate.

(1) Si, N and H Contents:

A SiON:H film having a thickness of 1 μm was formed on a 0.5 mm thick silicon wafer as the film-forming substrate. The resulting SiON:H film was examined using both elastic recoil detection analysis and Rutherford backscattering analysis, and the Si, N and H contents in the SiON:H film were determined. The results are shown in Table 1.

(2) N—H/Si—N Area Ratio and Si—H/Si—N Area Ratio:

A SiON:H film having a thickness of 1 μm was formed on a 0.5 mm thick silicon wafer as the film-forming substrate. The IR spectrum of the resulting SiON:H film was measured using a transmission Fourier transform infrared spectrometer. To exclude background absorption by the silicon wafer, the difference spectrum between the SiON:H film/Si wafer assembly and a silicon wafer was measured using a silicon wafer from the same lot as the reference. Next, baseline determination, baseline correction and peak separation were carried out as described above, the absorption surface areas for N—H bonds, Si—H bonds and Si—N bonds were determined, and the N—H/Si—N area ratio and the Si—H/Si—N area ratio were calculated. The results are shown in Table 1.

(3) Moisture Resistance:

A 3 μm thick SiON:H film was formed so as to cover a 100 nm thick calcium film. The resulting sample was left to stand in a thermostatic chamber at 95° C. and 50% RH for 1,000 hours, following which the affected surface area of the calcium film was measured and the moisture resistance of the SiON:H film was evaluated.

The calcium film is initially opaque. However, the reaction of primarily atmospheric moisture with the calcium results in the formation of calcium hydroxide, causing the film to become transparent in those areas where the reaction has taken place. In this production example, a photograph was taken of an area 500 μm×500 μm in size, the resulting image was subjected to "transparent" and "opaque" digitization, and the amount of moisture that passed through the SiON:H film and reached the calcium film was determined. The region photographed was the center of the sample where the variation in film thickness was smallest. The surface area percentage of unaffected places that did not become transparent was used as an indicator of the moisture resistance of the SiON:H film. The results are shown in Table 1

(4) Visible-Light Transmittance:

A spectroscopic ellipsometer was used to determine the attenuation coefficient of the film at a wavelength of 450 nm for the 1 μm thick SiON:H film on a silicon wafer produced in (2), and this coefficient was treated as an indicator of the visible-light transmittance. This was done because, when the transmittance is measured in the open air, the effects of the difference in refractive index with the atmosphere and of interference due to the film thickness are large. It is preferable to set the attenuation coefficient of the film at a wavelength of 450 nm to not more than $4.0 \times 10^{-4}$. In this way, the transmittance of visible light becomes at least about 95%. Attenuation coefficients of $4.0 \times 10^{-4}$ or below were obtained under all the conditions investigated.

(5) Film Stress:

A silicon wafer having a 4-inch diameter (approx. 10.2 cm) was used as the film-forming substrate. Prior to film formation, the warp of the silicon wafer was measured. Next, a 3 μm thick SiON:H film was formed, and the warp of the silicon wafer following film formation was measured. The SiON:H film stress was computed from the amount of change in the warp of the silicon wafer before and after film formation. The results are shown in Table 1.

TABLE 1

Effects of $N_2O$ flow rate ratio

| Sample No. | $N_2O$ flow rate (sccm) | Composition (at %) | | | | Si—H/Si—N area ratio | N—H/Si—N area ratio | Surface area ratio of unaffected area (%) | Film stress (MPa) |
|---|---|---|---|---|---|---|---|---|---|
| | | Si | N | H | O | | | | |
| 1 | 0 | 33.0 | 37.4 | 29.6 | <0.1 | 0.15 | 0.08 | 96 | 7 |
| 2 | 5 | 32.7 | 36.5 | 29.3 | 1.4 | 0.15 | 0.05 | 98 | 7 |
| 3 | 10 | 32.5 | 35.5 | 28.9 | 3.1 | 0.15 | 0.05 | 98 | 6 |
| 4 | 15 | 32.2 | 34.5 | 28.1 | 5.1 | 0.15 | 0.06 | 98 | 6 |
| 5 | 20 | 31.9 | 33.7 | 27.2 | 7.2 | 0.14 | 0.07 | 96 | 5 |
| 6 | 40 | 31.6 | 32.7 | 26.1 | 9.6 | 0.14 | 0.08 | 94 | 4 |

TABLE 1-continued

Effects of N₂O flow rate ratio

| Sample No. | N₂O flow rate (sccm) | Composition (at %) | | | | Si—H/Si—N area ratio | N—H/Si—N area ratio | Surface area ratio of unaffected area (%) | Film stress (MPa) |
|---|---|---|---|---|---|---|---|---|---|
| | | Si | N | H | O | | | | |
| 7 | 70 | 31.4 | 31.8 | 24.7 | 12.1 | 0.13 | 0.09 | 93 | 10 |
| 8 | 100 | 30.8 | 29.9 | 23.1 | 16.2 | 0.11 | 0.09 | 92 | 11 |

SiH₄ flow rate: 100 sccm;
NH₃ flow rate: 70 sccm;
Frequency of radio-frequency power: 27.12 Hz.

It is apparent from Table 1 that, as the flow rate ratio of N₂O to SiH₄ decreases, the Si—H/Si—N area ratio generally decreases. By contrast, the N—H/Si—N area ratio becomes smaller within a range in the N₂O flow rate of from 5 to 20 sccm, after which the N—H/Si—N area ratio becomes larger as the N₂O flow rate rises.

Regarding the moisture resistance, samples in a region where N₂O flow rates were from 5 to 20 sccm, i.e., where flow rate ratios of N₂O to SiH₄ were from 0.05 to 0.2, had an unaffected area surface area ratio of more than 98%, indicating that the SiON:H film had a good moisture resistance. These results agree with the decrease in the N—H/Si—N area ratio within the SiON:H film. This demonstrates that adding N₂O gas lowers the amount of hydrogen taken up into the SiON:H film in this region, which has the effect of suppressing the formation of N—H bonds in the SiON:H film.

In addition, it was confirmed that, under the conditions at which the film was formed, the absolute value for film stress can be held to 20 MPa or less, indicating that there is no danger of delamination. Moreover, the inventors have confirmed that, on setting the NH₃ flow rate to 150 sccm and the N₂O flow rate to 0 sccm, a SiN:H film having a stress of about 100 MPa forms. An organic EL device in which this film was used as a protective layer covering the substrate/bottom electrode/organic EL layer/top electrode was produced, whereupon non-illuminating areas were observed from the onset of illumination. It is believed that this is because, in areas where delamination arose, prior to illumination, the organic EL layer had deteriorated due to atmospheric moisture.

Production Example 2

In this production example, aside from setting the ammonia flow rate to 70 sccm, setting the nitrous oxide flow rate to 10 sccm, and changing the frequency of the radio-frequency power applied to 40.68 MHz or 13.56 MHz, the same procedure as in Production Example 1 was followed, thereby forming a SiON:H film on the film-forming substrate. The resulting SiON:H film was evaluated in the same way as in Production Example 1. The results are presented in Table 2.

TABLE 2

Effects of frequency of radio frequency power.

| Sample No. | Frequency (MHz) | Composition (at %) | | | | Si—H/Si—N area ratio | N—H/Si—N area ratio | Surface area ratio of unaffected area (%) | Film stress (MPa) |
|---|---|---|---|---|---|---|---|---|---|
| | | Si | N | H | O | | | | |
| 3 | 27.12 | 32.5 | 35.5 | 28.9 | 3.1 | 0.15 | 0.05 | 98 | 6 |
| 9 | 40.68 | 31.9 | 36.5 | 27.6 | 4.0 | 0.14 | 0.04 | 98 | 10 |
| 10 | 13.56 | 27.4 | 38.3 | 31.3 | 3.0 | 0.18 | 0.12 | 25 | 5 |

SiH₄ flow rate: 100 sccm;
NH₃ flow rate: 70 sccm;
N₂O flow rate: 10 sccm

It is apparent from Table 2 that Sample 9 produced using 40.68 MHz radio-frequency power, like Sample 3 producing using 27.12 MHz radio-frequency power, exhibited excellent properties. In Sample 10, produced using 13.56 MHz radio-frequency power, on the other hand, it was observed that, at the same time that the nitrogen and hydrogen contents in the film increase, both the Si—H/Si—N area ratio and the N—H/Si—N area ratio increase. This appears to arise because SiH₄ and both NH₃ and N₂O do not fully decompose within the reaction chamber. Due to this change in film quality, the surface area of unaffected regions of the sample 10 dramatically decreased. That is, the SiON:H film was found to have a markedly lower moisture resistance.

From these results, the quality of the SiON:H film cannot be determined solely based on the nitrogen content in the film, and varies markedly with the Si—H/Si—N area ratio and the N—H/Si—N area ratio.

Working Example 1

In this working example, a red-emitting organic EL device having a pixel count of 2×2 and pixel dimensions of 0.3 mm×0.3 mm was produced.

Fusion glass (Corning 1737 glass, 50×50×1.1 mm) was furnished as the substrate. A sputtering process was used to deposit a silver film having a thickness of 100 nm on the substrate. The resulting silver film was patterned by a photolithographic process, thereby forming a bottom electrode composed of two stripe-like electrodes, each having a width of 0.3 mm.

Next, the substrate on which the bottom electrode had been formed was placed within a resistance heating vapor deposition system. A buffer layer composed of lithium and having a thickness of 1.5 nm was formed on the bottom electrode 21 by vapor deposition using a mask. An organic EL layer composed of four layers (electron transport layer/emissive layer/hole transport layer/hole injection layer) was then formed using vapor deposition processes. The electron transport layer was $Alq_3$ having a film thickness of 20 nm, the emissive layer was DPVBi having a film thickness of 30 nm, the hole transport layer was α-NPD having a film thickness of 10 nm, and the hole injection layer was CuPc having a film thickness of 100 nm. At the time of organic EL layer formation, the pressure within the vacuum chamber of the system was set to $1 \times 10^{-4}$ Pa, and each layer was formed at a film-forming rate of 0.1 nm/s. A MgAg film having a thickness of 5 nm was subsequently formed by a vapor deposition process as a damage mitigation layer.

Next, the multilayer assembly in which the damage mitigation layer had been formed was transferred to a facing target sputtering system without breaking the vacuum. IZO was deposited thereon to a film thickness of 100 nm by a sputtering process using a metal mask, thereby forming a transparent top electrode. The top electrode was composed of two stripe-like electrodes of 0.3 mm width which extended in a direction perpendicular to the stripe-like electrodes of the bottom electrode.

Next, the laminate in which the top electrode had been formed was transferred to a plasma CVD system, where a SiON:H film was deposited thereon using the conditions of Sample 3 in Production Example 1, thereby forming a protective layer. That is, a SiON:H layer was formed by using a mixed gas of monosilane, ammonia, nitrous oxide and nitrogen as the source gas and applying radio-frequency power having a frequency of 27.12 MHz and a power density of 0.5 W/cm². The flow rates of the monosilane, ammonia, nitrous oxide and nitrogen at this time were set at, respectively, 100 sccm, 80 sccm, 10 sccm and 2,000 sccm. The pressure within the system during film formation was set at 100 Pa, and the temperature of the stage supporting the film-forming substrate was set at 50° C. By means of these steps, an organic EL element composed of a bottom electrode/organic EL layer/top electrode/protective layer was formed on the substrate. The resulting organic EL element was transferred into a bonding system where the interior environment was adjusted to an oxygen concentration of not more than 5 ppm and a moisture concentration of not more than 5 ppm.

In a separate procedure, fusion glass (Corning 1737 glass, 50×50×1.1 mm) was furnished as a sealing substrate. A red color filter material (Color Mosaic CR7001 (available from Fuji Film Electronics Materials)) was coated onto the transparent substrate and patterning was carried out, thereby forming a red color filter layer composed of four areas having dimensions of 0.5 mm×0.5 mm at positions corresponding to the pixels of an organic EL element. The red color filter layer had a thickness of 1.5 μm.

Next, the sealing substrate on which the red color filter layer had been formed was placed in a resistance heating vapor deposition system. Using a vapor deposition process, a red conversion layer having a thickness of 300 nm and containing Coumarin 6 and DCM-2 was deposited on the red color filter layer. The Coumarin 6 and DCM-2 were each heated in separate crucibles, with the Coumarin 6 vapor deposition rate being set to 0.3 nm/s and the DCM-2 vapor deposition rate being set to 0.005 nm/s. The molar ratio of Coumarin 6:DCM-2 in the red conversion layer was 49:1. By means of this step, a sealing substrate having a red-converting color filter layer was formed. The sealing substrate obtained was transferred into the above-described bonding system.

Next, within the bonding system, an epoxy-based UV-curable adhesive was deposited as drops along the peripheral edge of the sealing substrate surface on which the red-converting color filter layer had been formed. The substrate on which the organic EL element had been formed and the sealing substrate on which the red-converting filter layer had been formed were pre-bonded in such a way that the red-converting color filter layer and the organic EL element faced each other and the position of the red-converting color filter layer corresponded with the organic EL element pixels. The interior of the bonding system was then reduced to a pressure of about 10 MPa, and the substrate and sealing substrate were bonded together. After the completion of bonding, the pressure within the bonding system was raised to atmospheric pressure.

Next, using a mask, only the UV-curable adhesive at the outer periphery of the sealing substrate was irradiated with UV light, thereby pre-curing the adhesive. The bonded assembly was then heated to 80° C. over a period of 1 hour within a heating furnace to induce curing of the adhesive, thereby forming an adhesive layer and thus obtaining an organic EL device. Following the completion of heating, the organic EL device was allowed to cool over a period of 30 minutes within the heating furnace, then removed from the furnace.

Comparative Example 1

Aside from carrying out formation of the SiN:H film used as the protective layer in the same way as for Sample 1 in Production Example 1, an organic EL device was formed by repeating the same procedure in Working Example 1. That is, in the production of the organic EL device, the ammonia flow rate during SiN:H film formation was changed to 70 sccm.

The organic EL devices obtained in Working Example 1 and Comparative Example 1 were placed in a 60° C., 90% RH environment and continuously driven for a period of 1,000 hours by passing through the devices an electrical current having a current density of 0.1 A/cm², and the voltage and luminance at that time were measured. The luminous efficiency was determined by dividing the luminance by the current value. Based on an arbitrary value of 1 for the luminous efficiency of the organic EL device in Working Example 1, the initial luminous efficiency of the organic EL devices in Working Example 1 and Comparative Example 1 and the luminous efficiency after 1,000 hours of continuous driving relative thereto were determined. The results are presented in Table 3.

TABLE 3

| | Luminous efficiency | |
|---|---|---|
| | Initial | After 1,000 hours of continuous driving |
| Working Example 1 | 1 | 0.9 |
| Comparative Example 1 | 1 | 0.8 |

It is apparent that the device in Comparative Example 1, when compared with Working Example 1, had a decreased luminous efficiency after 1,000 hours of continuous driving. In the device in Comparative Example 1, the decline in luminous efficiency appears to have proceeded as a result of moisture infiltration through the SiN:H film used as the protective layer.

The invention claimed is:

1. An organic EL device, comprising:
a substrate; and
an organic EL element formed on the substrate,
wherein the organic EL element comprises; a bottom electrode;
an organic EL layer;
a top electrode; and
a protective layer,
wherein the protective layer is composed of one or a plurality of inorganic films, and at least one of the one or plurality of inorganic films is a hydrogen-containing silicon oxide nitride film having stretching-mode peak area ratios, as determined by infrared absorption spectroscopy, that include an absorption area ratio of N—H bonds to Si—N bonds in the hydrogen-containing silicon oxide nitride film which is not less than 0.04 but not more than 0.07 and an absorption area ratio of Si—H bonds to Si—N bonds which is not more than 0.15.

2. The organic EL device according to claim 1, wherein the protective layer is positioned between the substrate and the bottom electrode.

3. The organic EL device according to claim 2, wherein each of the one or plurality of inorganic films has a stress with an absolute value smaller than 20 MPa.

4. The organic EL device according to claim 1, wherein the protective layer is positioned on a top side of the top electrode.

5. The organic EL device according to claim 4, wherein each of the one or plurality of inorganic films has a stress with an absolute value smaller than 20 MPa.

6. The organic EL device according to claim 1, wherein each of the one or plurality of inorganic films has a stress with an absolute value smaller than 20 MPa.

7. The organic EL device according to claim 1, wherein absorption areas for the N—H bonds, Si—H bonds and Si—N bonds are determined by the steps of: (a) measuring an infrared absorption spectrum for the silicon oxide nitride film with wavenumber as the horizontal axis, (b) correcting the infrared absorption spectrum by subtracting a baseline therefrom, (c) peak-separating the absorption of the N—H bonds, Si—H bonds and Si—N bonds by using Gaussian functions, and (d) determining surface areas of the separated peaks, and
the absorption area for the N—H bonds is determined from a peak present at 3250 to 3400 $cm^{-1}$, the absorption area for the Si—H bonds is determined from a peak present at 2100 to 2200 $cm^{-1}$, and the absorption area for the Si—N bonds is determined from a peak present at 830 to 870 $cm^{-1}$.

8. A method of manufacturing an organic EL device, comprising the steps of:
(1) preparing a substrate; and
(2) forming an organic EL element including a bottom electrode an organic EL layer a top electrode and a protective layer composed of one or a plurality of inorganic films in which at least one of the one or a plurality of inorganic films is a hydrogen-containing silicon oxide nitride film having stretching-mode peak area ratios, as determined by infrared absorption spectroscopy, that include an absorption area ratio of N—H bonds to Si—N bonds in the hydrogen-containing silicon oxide nitride film which is not less than 0.04 but not more than 0.07 and an absorption area ratio of Si—H bonds to Si—N bonds which is not more than 0.15,
wherein, in step (2), the hydrogen-containing silicon oxide nitride film is formed by chemical vapor deposition in which radio frequency power of at least 25 MHz but not more than 60 MHz is applied to a mixed gas containing monosilane, ammonia and nitrogen at a flow rate ratio of ammonia to monosilane which is at least 0.5 but not more than 1 and a flow rate ratio of $N_2O$ to monosilane which is greater than 0 but smaller than 0.2.

* * * * *